United States Patent
Nolte et al.

(10) Patent No.: US 6,342,721 B1
(45) Date of Patent: Jan. 29, 2002

(54) ENHANCED NON-STEADY-STATE PHOTO-INDUCED ELECTROMOTIVE FORCE DETECTOR

(75) Inventors: David Douglas Nolte; John Anthony Coy, both of Lafayette, IN (US); Marvin B. Klein, Pacific Palisades, CA (US); G. David Bacher, Santa Ana, CA (US); Meng P. Chiao, Santa Monica, CA (US); Gilmore Joseph Dunning, Newbury Park, CA (US); Kenneth Bacher, Perkasie, PA (US); David M. Pepper, Malibu, CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/329,771

(22) Filed: Jun. 10, 1999

Related U.S. Application Data

(60) Provisional application No. 60/107,367, filed on Nov. 6, 1998.

(51) Int. Cl.⁷ .................. H01L 31/0224; H01L 31/04
(52) U.S. Cl. .................. 257/448; 257/184; 257/435; 257/457; 250/370.14
(58) Field of Search ................. 257/184, 435, 257/448, 457; 250/370.14

(56) References Cited

U.S. PATENT DOCUMENTS

| | | | | |
|---|---|---|---|---|
| 5,451,769 A | * | 9/1995 | McAdoo | 257/457 |
| 5,512,763 A | * | 4/1996 | Allam | 257/457 |
| 6,157,035 A | * | 12/2000 | Kuijk | 257/435 |

* cited by examiner

Primary Examiner—Jerome Jackson, Jr.
(74) Attorney, Agent, or Firm—Walter A. Hackler

(57) ABSTRACT

A photo-EMF detector for the collection of photons includes a substrate formed of a photorefractive semiconductor and a plurality of interlaced electrode pairs disposed over the substrate. Each electrode pair includes two parallel electrodes defining an active area therebetween for the collection of photons. One electrode of each pair is disposed between an adjacent pair of electrodes and proximate one electrode of the adjacent pair, light from striking a substrate surface between proximate electrodes and outputs from each of the plurality of interlaced electrode pairs are collected.

32 Claims, 4 Drawing Sheets

ENHANCED NON-STEADY-STATE PHOTO-INDUCED ELECTROMOTIVE FORCE DETECTOR

This Appln claims benefit of Prov. No. 60/107,367 filed Nov. 6, 1998.

The present invention generally relates to detectors for the collection of photons and more particularly relates to non-steady-state photoinduced electromotive force (photo-EMF) detectors.

Non-steady-state photoinduced electromotive force (photo-EMF) devices can generate time-varying photocurrents in response to a corresponding lateral and rapid shift of an optical pattern across its surface, and rely on the formation of space-charge gratings in semi-insulating materials.

In a typical application, the optical pattern is the result of a set of optical fringes incident on the detector (generated by the interference of a pair of coherent beams), and its lateral shift is due to a rapid phase shift of one beam relative to the other. Transient photocurrents are detected in an external circuit when the differential phase modulation frequency on one or both beams exceeds the response rate of the space-charge gratings. The non-steady-state photo-electromotive-force was proposed and first experimentally demonstrated by Petrov et al. (Sov. Tech. Phys. Lett 12, 379 (1986))

Using this detection technique in a homodyne interferometer, Stepanov et al, showed that vibration amplitudes could be measured in the picometer range, which is in the range of surface displacement induced by laser-based ultrasound. (Opt. Lett. 15, 1239 (1990)).

This laser homodyne receiver is adaptive, removing the effects of speckle and compensating for low-frequency (<10 kHz) environmental perturbations. One drawback of the photo-EMF detector is its relatively low homodyne detection responsivity per radian of optical phase modulation (~$10^{-5}$ A/W-radian).

The low responsivity of the photo-EMF detector is caused, in part, by the large electrode spacing relative to the drift length of the photocarriers. The relevant figure of merit that characterizes the responsivity is the photoconductive gain g, which can be defined as $$g = \frac{L_D}{W} = \frac{\tau}{\tau_{transit}}$$

where $L_D$ is the drift length, W is the electrode spacing, T is the carrier lifetime and $T_{transit}$ is the carrier transit time across the electrode width W.

Higher responsivity at constant incident optical power can be obtained by reducing the electrode spacing in transverse-contact devices and focusing the optical beams. However, focusing the highly speckled beams is not typically compatible with the small reference beam/signal beam crossing angles that are required for optimum grating period. Higher responsivity values can also be obtained using longitudinal electrodes in thin broad-area devices using tilted gratings, but the high capacitance of this geometry, coupled with the need for grazing-angle addressing of the device, pose practical bandwidth and field-of-view limitations of this approach, respectively.

The present invention provides for transverse-field geometry photo-EMF devices that have improved responsivity at constant power and detection area without the need to focus tightly, therefore, allowing the optimum beam crossing angle in laser-based ultrasound receiver applications. The devices use asymmetric interdigitated contacts (AIDC) with alternating wide and narrow active-area spacings, with the current s from the wide-spaced active-area regions summed, while the narrow areas are optically blocked or rendered insensitive.

SUMMARY OF THE INVENTION

A photo-EMF detector for the collection of photons generally includes a substrate formed from a semi-insulating semiconductor, with sufficient carrier trap density to form an effective space charge grating, along with a plurality of interlaced electrode pairs disposed over the substrate. Each electrode pair includes two parallel electrodes defining an active area therebetween for the collection of photons, with one electrode of each pair being disposed between an adjacent pair of electrodes and proximate one electrode of the adjacent pair.

Importantly, means are provided for preventing back action current between proximate electrodes. Such back action current is of opposite sign, or direction, and will oppose the desired output. The means for preventing back action current may comprise a means for preventing light from striking the substrate between the proximate electrodes or a means for desensitizing the substrate between the proximate electrode, as, for example, implanting ions into the substrate.

More particularly, the means for preventing light from striking the substrate may comprise a reflecting or absorbing layer extending between the proximate electrodes. Alternatively, back action current may be prevented by utilizing grooves in the substrate between proximate electrodes or for providing slots in the substrate between proximate electrodes. The groove and slots also provide a means for reducing capacitance between proximate electrodes.

Means are provided for collecting outputs from each of the plurality of interlaced electrode pairs. In essence, the current is collectively summed across every other electrode pair.

Importantly, each electrode pair includes two electrodes defining an active area therebetween which can be small enough (i.e., one active area region per fringe spacing) to collect current from every fringe of a set of optical fringes incident the detector. Accordingly, the photo-EMF detector in accordance with the present invention provides improved responsivity for a constant detector area without the need to focus.

In order to provide in-phase current collection, means are provided for summing outputs is provided. In addition, in one embodiment of the present invention, a heterostructure may be disposed between the substrate and the plurality of interlaced electrode pairs.

In one embodiment of the present invention, a detector may be provided with a first and a second plurality of electrodes arranged with one another on a substrate as hereinabove described. The first and second plurality may be disposed on the substrate adjacent one another (i.e., side by side) on the substrate or in a stacked relationship on the substrate. In the side by side relationship and the stacked relationship, the plurality of electrodes may be perpendicular with one another. Alternatively, in the side by side relationship, the first and second plurality of electrodes may be parallel with one another.

In addition, areas between the side by side relationship, the substrate may be desensitized between the pluralities of electrodes.

BRIEF DESCRIPTION OF THE DRAWINGS

A better understanding of the present invention may be had with consideration of the following detailed description, taken in conjunction with the accompanying drawings in which.

DETAILED DESCRIPTION

Figure 1:
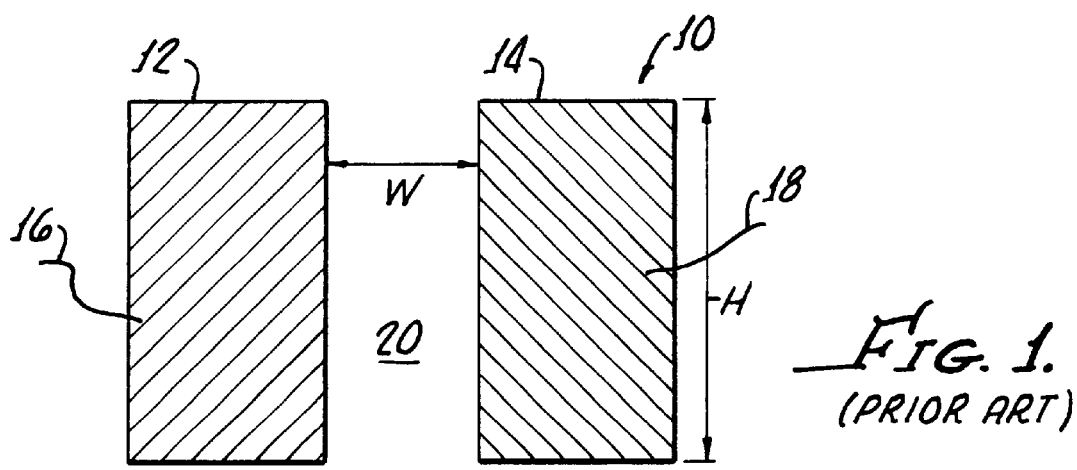
FIG. 1 is a representation of the prior art photo-EMF detector utilizing one pair of electrodes with an active area therebetween.

With reference to FIG. 1, there is shown a representation of an electrode layout for a prior art photo-EMF detector 10, which includes a pair of spaced apart electrodes 12, 14 having an active width W therebetween. A length, or height, of the electrodes 12, 14 is represented by the letter H. Electrical lead wires 16, 18 attached to the electrodes 12, 14 in a conventional manner are connected to a transimpedance amplifier (not shown).

The electrodes 12, 14 are disposed on a substrate 20, as hereinafter discussed in greater detail. The detector 10 is a standard transverse-field photo-EMF detector design at wavelengths with photon energies above the band gap. The total collection area (W×H) is about 9.0 mm². Because the electrode 12, 14 spacing is large with regard to the diffusion length of the photo carriers, the photoconductive gain is low and the prior art detector 10 thus has low responsitivity, as hereinabove noted. As also hereinabove mentioned, higher responsitivities may be obtained by simultaneously reducing the electrode spacing and focusing, however, such focusing is not typically compatible with small reference beam/signal beam crossing angles that are required for optimum grating spacing.

Figure 2:
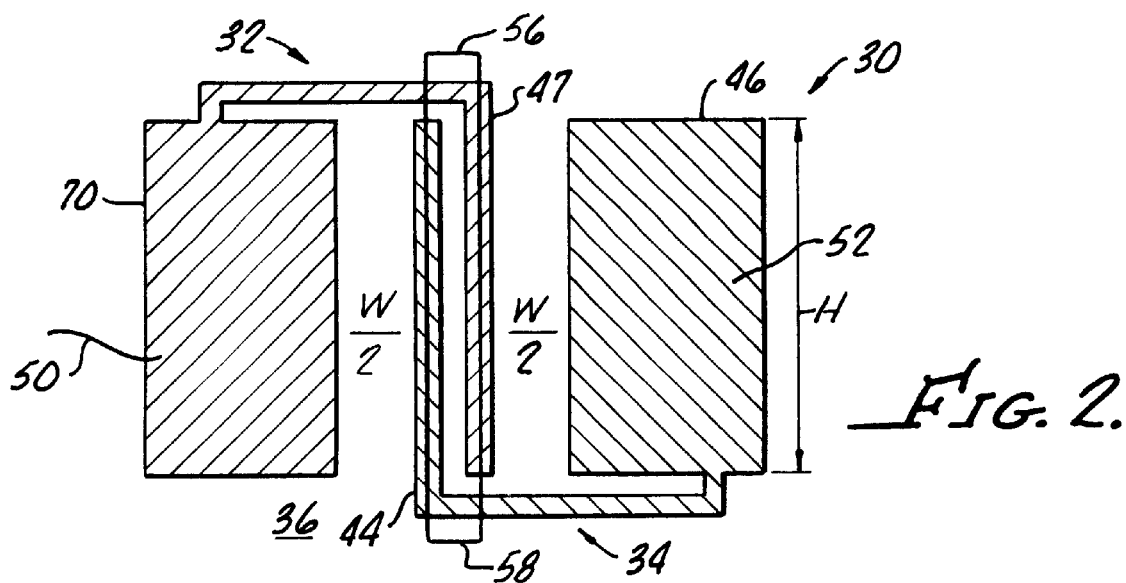
FIG. 2 is a representation of a photo-EMF detector in accordance with the present invention utilizing two pairs of interlaced, or interdigitated, contacts having the same active area as the prior art detector shown in FIG. 1.

In accordance with the present invention, as represented in FIG. 2, a photo-EMF detector 30 includes a plurality of interlaced electrode pairs 32, 34, disposed over a substrate 36. Each electrode pair 32, 34, includes two parallel electrodes 40, 42 and 44, 46, respectively, defining active areas W/2 therebetween for the collection of photons.

Importantly, one electrode 44 of each pair 32, 34, is disposed between an adjacent pair 32, 34 of electrodes and proximate one electrode 42 of the adjacent pair 34.

Electrical lead wires 50, 52 provide a means for collecting output from each of the plurality of interlaced electrode pairs 32, 34 and may be attached to electrodes 40, 46, respectively, in a conventional manner.

It is important to provide a means for preventing, or reducing, back action current between the proximate electrodes 42, 44 as hereinabove noted. In the embodiment 30, back action current is prevented by a layer 56, such as, for example, light reflecting or light absorbing, layer, which provides a means for preventing light from striking the substrate surface between the proximate electrodes 42, 44.

Alternatively, a groove or slot 48 may be provided in the substrate 20 between the electrodes 42A, 44A, which functions to maintain a high resistivity between the electrodes 42, 44 so that they do not short the photo-EMF signal generated by the wide pairs 32, 34, and block the negative-polarity photo-EMF signal that would otherwise cancel the positive contributions from the desired broad active areas W/2.

The slots, or grooves, 48 have an added feature in that such structure reduces the capacitance between the proximate electrodes 42A, 44A. This, in turn, enables operating higher bandwidth of the detector 58 because the operating bandwidth is inversely proportioned to capacitance between electrodes when such capacitance is large.

Alternatively, back action current may be prevented, or reduced, by desensitizing the substrate between the electrodes 42A, 44A. That is, incident photons are rendered less effective in producing current in the desensitized area. This can be accomplished by implanting ions, such as protons into the substrate between the electrodes 42A, 44A, as is well known in the art.

While the interdigitated contacts have been common in metal/ semiconductor/metal (MSM) photoconductors, W.Roth, IEE, Trans. Electron Dev. 32, 1034 (1985); M. Ito et al, IEEE J. Quant.Electron. QE-22, 1073 (1986); J. H. Burroughes, IEEE Photon. Tech.Lett. 3,660 (1991); no blocking is provided or necessary as in the present invention in order to prevent back action on the directional photo-EMF current.

Figure 3:
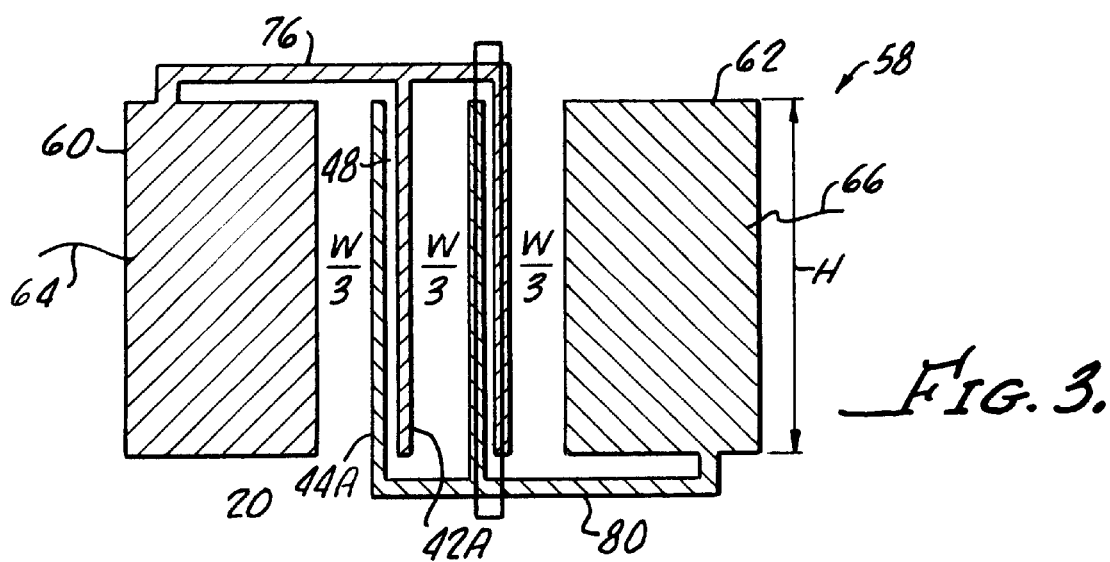
FIG. 3 is a representation of a photo-EMF detector in accordance with the present invention utilizing three interlaced, or interdigitated, contact with an active area equal to the photo-EMF detectors shown in FIGS. 1 and 2.

With reference to FIG. 3, there is shown a photo-EMF detector utilizing three pairs of electrodes defining three active areas W/3 in a manner similar to that shown in FIG. 3, with outer electrodes 60, 62, interconnected to an amplifier (not shown) by lead wire 64, 66.

In all of the represented detectors 10, 30, 58, the active area W is shown constant and detectors have been made using this criteria in order to more clearly illustrate the enhanced output of detectors 30, 58, as compared to the prior art detector 10.

Figure 4:
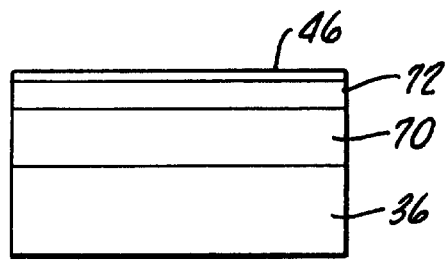
FIG. 4 is a cross section representation of a photo-EMF detector in accordance with the present invention.

With reference to FIG. 4, there is shown a representative cross section of the detector shown in FIG. 2 showing an electrode 46 over a substrate 36. In addition, a heterostructure, such as, for example, an active detector epilayer 70 may be provided in order to provide optimized detector properties in layer 70. For example, by tuning the band gap for absorption at a desired wavelength. The epilayer may be formed from alloys with different bandgaps or mobilities and provided with an antireflection coating 72 in order to minimize the loss of photons from the structure 70.

The electrode 46 is applied over the substrate 36 as hereinafter described.

Any number of electrode pairs (not shown for the sake of clarity) may be utilized in accordance with the present invention. One of the scaling aspects of transverse-field photo-EMF devices is the independence of signal on electrode spacing at constant intensity, because the increased responsivity for smaller spacings is balanced by the decreased power. Accordingly, each narrow pair, if not shielded, would contribute an equal and opposite signal to each wide pair. In the present invention, buses 76, 80 provide a means for collecting outputs from the plurality of interlaced electrode pairs in a summing manner.

Because the proximate electrodes 42, 44 are blocked by the opaque layer 56, or rendered optically insensitive, they do not contribute to the photo-EMF signal and the area between these pairs is made as small as possible because it represents dead space. This requirement gives the detector an electrode design in accordance with the present invention its asymmetry.

It is important to state again that a detector 10, with widely-spaced electrodes, will have low photoconductive gain. By using the electrode design in accordance with the present invention, the electrode spacing can be made small (limited by the fringe spacing or the diffusion length) to increase the photoconductive gain. The current from an array of such detectors can be summed, while maintaining constant optical power and constant overall detector area.

Figure 8:
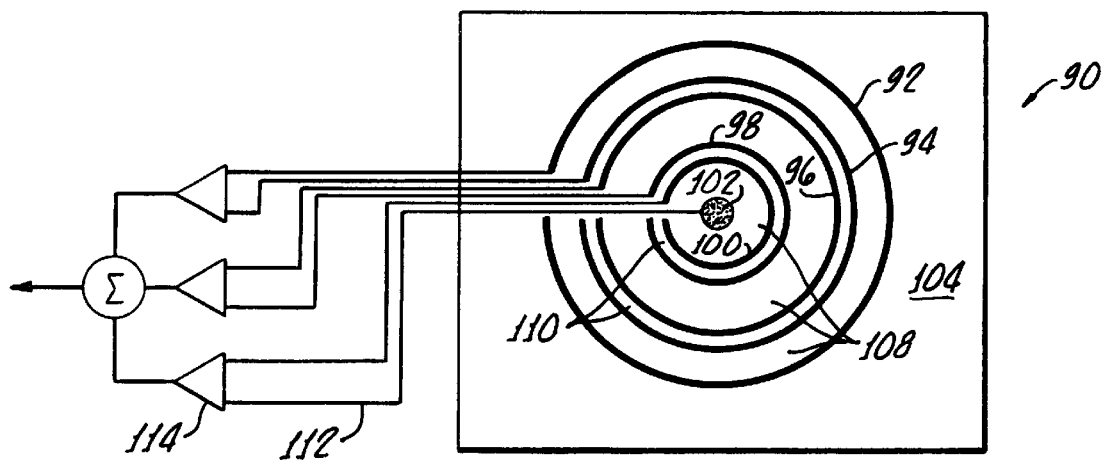
FIG. 8 is a plane view representation of a photo-EMF detector with coaxial electrodes in accordance with the present invention.

Turning now to FIG. 8, there is shown an alternative embodiment of detector 90 in accordance with the present invention which includes continuous electrodes 92, 94, 96, 98, 100, 102, disposed on a substrate 104 with active areas 108 between electrodes 92, 94, 96, 98, and 100 and 102.

Proximate electrodes 94, 96, 98, 100 may include an opaque layer 110, as hereinabove discussed, which provides a means for preventing back action current between the proximate electrodes 94, 96, 98, 100. A plurality of conductors 112 and amplifiers 114 provide a means for collecting outputs from each of the plurality of electrode pairs 92, 94, 96, 98, 100, 102.

Figure 9:
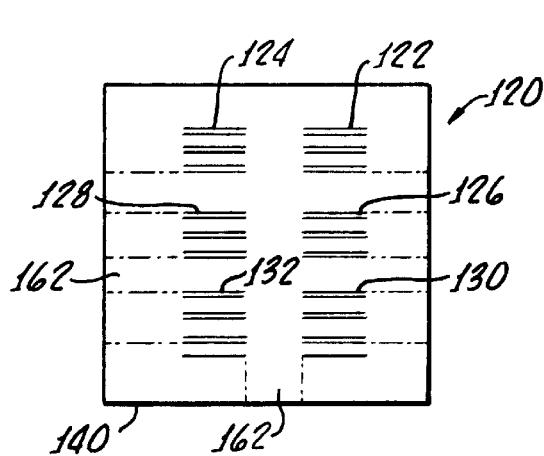
FIG. 9 is a plane view representation of a photo-EMF detector in accordance with the present invention showing sets of electrodes disposed on a substrate with a parallel, or pluralities, relationship between the electrode sets.

Another embodiment detector 120 is represented in FIG. 9 and includes various sets 122, 124, 126, 128, 130, 132, on a substrate 130 the electrode sets are substantially as described hereinabove in connection with detectors 30 and 58. In this embodiment 12, the electrodes in the sets are parallel with one another.

The detector 120 with separate sets 124–130 of electrodes is robust in that individual electrodes can fail (e.g., because electrically open) and the detector will still function. In this manner, reliability of the detector, by having multiple separate electrodes, is enhanced.

Importantly, a first plurality, or set, of interlaced electrode pairs 122 is oriented in a perpendicular relationship within adjacent plurality, or set, of adjacent electrodes 124. This arrangement may be repeated over a large area of the substrate 130, only four sets 122, 124, 126, 128 being shown for the sake of simplicity. Further, electrical leads, or conductors, and amplifiers are not shown in order to further clarify the presentation of the detector 120.

Figure 10:
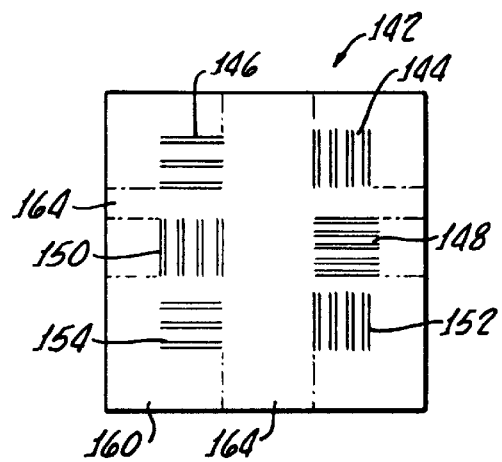
FIG. 10 is a plane view representation of a photo-EMF detector in accordance with the present invention showing sets, or pluralities, of electrodes disposed on a substrate with a perpendicular relationship between the electrode sets.

Yet, another embodiment 142 is illustrated in FIG. 10. This detector 142 is similar in constant to detector 120 shown in FIG. 9 except that each electrode set 144, 146, 148, 150, 152, 154 are arranged perpendicular with one another on a substrate 160.

Importantly, this arrangement enables two dimensional fringe, or speckle, detectors. That is, this arrangement provides for measurement in orthogonal directions in the plane of the detector. Again, reliability is provided by the multiple sets 144–154 of electrodes.

In added substrate areas 162, 164 between electrical sets 122–132 and 144–160 may be desensitized as hereinabove described.

Figure 11:
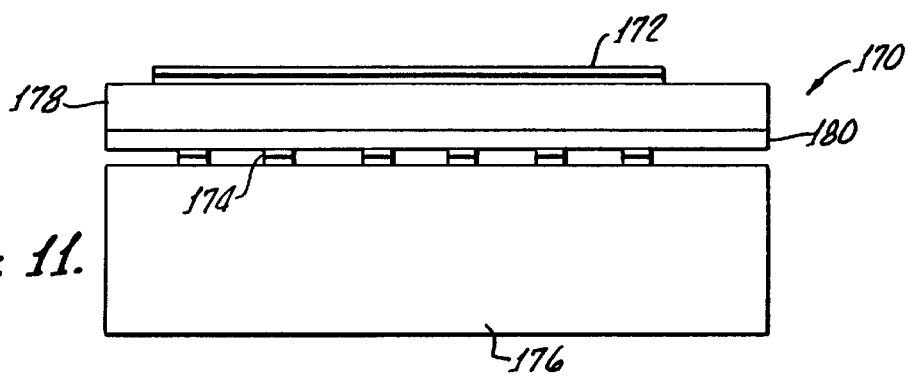
FIG. 11 is a cross sectional representation of a photo-EMF detector in accordance with the present invention showing sets, or pluralities, of electrodes disposed on a substrate with a stacked and perpendicular relationship between the electrode sets.

Turning now to FIG. 11, there is represented a detector 170 having stacked sets 172, 174 of electrodes arranged in a perpendicular relationship on a substrate 176, 178. The arrangement of the electrode sets 172, 174 and substrate are as hereinabove described in connection with detectors 30, 58. The substrate 178 is sufficiently thin to enable passage of photon therethrough for detection by the second set 174 of electrodes.

In order to prevent electrical current between the electrode sets 172, 174, an optically transparent, electrically insulated layer 180 is disposed between the sets, or pluralities, 172, 174 of electrodes. A suitable layer is glass.

EXAMPLE

The three photo-EMF design shown in FIGS. 1–3, were fabricated on semi-insulating liquid-encapsulated Czochralski (LEC) GaAs wafers. The electrical contacts were defined using lift-off photolithographic techniques and metalization. Several different contacts were used, including Ti/Au non-alloyed contacts, and Au/Ge alloyed contacts. The Au/Ge contacts were annealed at either 450° C. for 10 minutes, or 350° C. for 1 minute. Electrical leads were attached to the bonding pads of the AIDC by aluminum wire bonding and the device was mounted on integrated circuit boards that fit inside a laboratory prototype transimpedance amplifier package that provides these stages of amplification, giving a total amplification of 500 K V/A with a load resistance of 50 Ohms.

Non-steady-state photo-EMF characterization was performed using an electro-optic phase modulator to simulate sinusoidal equivalent surface displacement at frequencies from 0.5 Mhz to 25 MHz. The reference and signal beams originated from an intensity-stabilized argon ion laser with a wavelength of 515 nm, which has a photon energy significantly higher than the band-edge of the GaAs. The above-bandgap illumination is essential to the operation of the interdigitated contacts because the absorption depth of about 1 micron is much smaller than the electrode spacing; the AIDC concept will not work on bulk detectors using below-bandgap light.

The light beams were spatially filtered and expanded to a top hat beam with a diameter of 7 mm, ensuring uniform illumination over the 2.25×4 $mm^2$ aperture of the devices. The crossing angle between the reference and the signal beam could be varied continuously to give space-charge fringe spacings between 8 um to 200 um. The equivalent surface displacement of the phase modulator was calibrated at each frequency using a Mach-Zehnder interferometer. The amplified photo-EMF output signal from the prototype amplifier package was analyzed on an rf spectrum analyzer. The responsivity in this configuration is calibrated against the equivalent surface displacement, and is given in units of mV per nm displacement for unit intensity.

Figure 5:
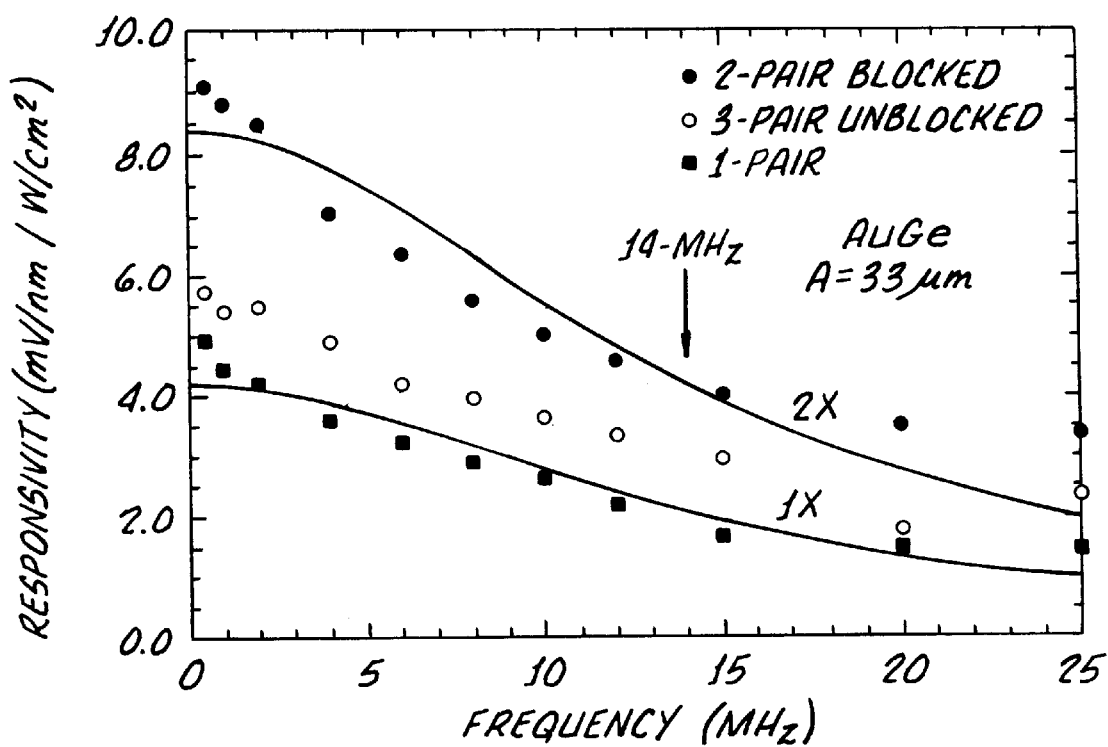
FIG. 5 is a plot of responsitivity for the prior art device shown in FIG. 1 compared with the photo-EMF detector in accordance with the present invention shown in FIG. 2.

The basic operation of the prior art detector shown in FIG. 1, is diagrammed in FIG. 5 along with the (2 pair) detector 30 shown in FIG. 2. In FIG. 5, the response of the 2-pair device is compared to the conventional 1-pair device 10 with AuGe contacts at a fringe spacing of 33 um under an intensity of 105 $mW/cm^2$ with a beam ratio and fringe contrast near unity.

Two data sets are shown for the 2-pair device 30 with the proximate electrodes 42, 44 blocked with one opaque layer and with the proximate electrodes 42, 44 unblocked. The response of the blocked 2-pair device 30 has approximately twice the responsivity constant detection area as the 1-pair device 10.

When the near-pair is unblocked and illuminated, the responsivity of the 2-pair device 30 drops close to that of the 1-pair device 10 as expected. In this case, the photo-EMF current from one of the desired (wide)active areas W/2 is canceled by that from the undesired (narrow) area between the proximate electrodes 42, 44, the latter of which is opposite in polarity.

Under these conditions, only the photocurrent from one wide-area region remains in the output current summation.

The blocked 2-pair and 1-pair data are fit by a single function describing a capacitive low-pass circuit. The roll-off frequency is 14 MHz, which is a function of the feedback resistance and stray capacitance of the detection system.

Figure 6:
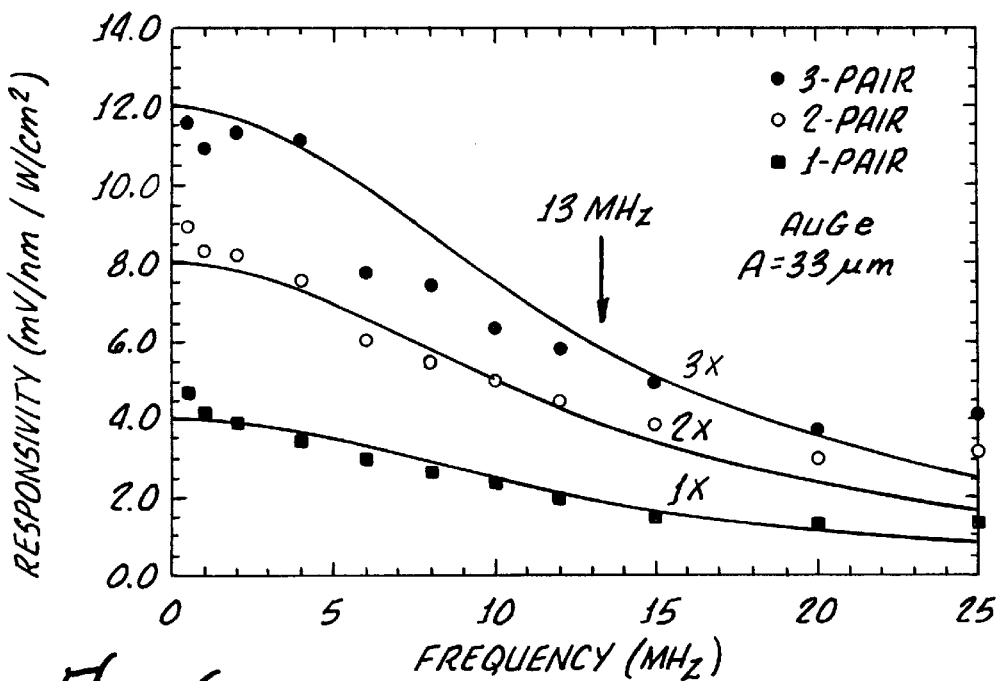
FIG. 6 is a plot of frequency-dependence of the photo-EMF devices shown in FIGS. 1–3.

The frequency performance of all three electrode devices is shown in FIG. 6 with an intensity of 105 mW/cm$^2$ and a fringe spacing of 33 um. A single function is fit to all the data, with a multiplier of 2× and 3× relative to the 1-pair device 10, showing the improved responsivity of the decreasing contact separation. A single frequency fits each device, demonstrating that the added capacitance of additional contact fingers is smaller than the stray capacitance of the detection system. This demonstration verifies the detection enhancement capability of the asymmetric interdigitated contact (AIDC) structure of the present invention.

Figure 7:
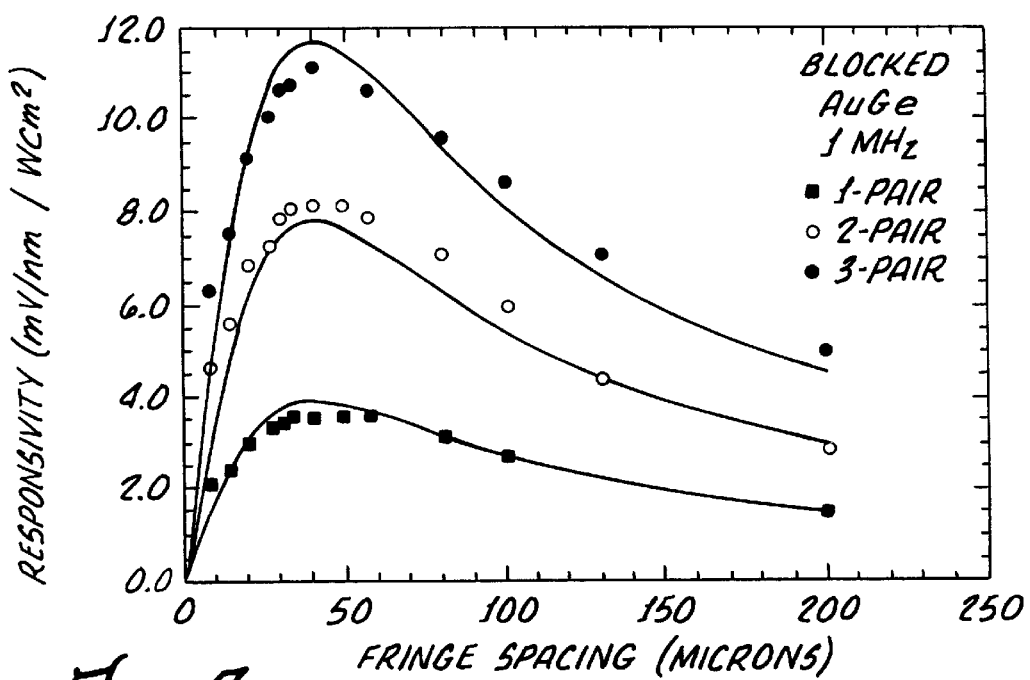
FIG. 7 is a plot of fringe spacing dependence of the photo-EMF detector shown in FIGS. 1–3.

The fringe spacing dependence for the three devices is shown in FIG. 7 for an intensity of 85 mW/cm$^2$ with a beam ratio near unity using a 1 MHz phase-modulated probe beam as the signal. All the data are fit by a single function that is multiplied by 2× and 3× relative to the 1-pair device. The functional dependence is characteristic of the fringe spacing dependence of the photo-EMF with linear dependence at small fringe spacing and inverse dependence at high fringe spacing. The maximum in the response curve for the three devices occurs at 40 um, which is determined by the defect density in the semi-insulating substrate.

The data and function fits in FIGS. 5–7 demonstrate the sample scaling for the 1-pair, 2-pair and 3-pair devices with decreasing finger spacing in the wide-area part of the AIDC. No significant increase in device capacitance was observed with increasing number of pairs and no significant effect on the fringe-spacing dependence was caused by the decreasing electrode spacing.

Therefore, these data suggest that the simple scaling of responsivity constant detection area with electrode spacing is obeyed accurately for up to three electrode pairs. No indication is seen for any violation of the scaling, which suggests that the number of pairs can be extended upwards with subsequent improvement of the constant-area responsitivity.

It should be noted that electrode spacing cannot fall beneath one fringe spacing, or one diffusion length, because the contacts will disrupt the formation of space-charge and destroy the photo-EMF process. This practically limits the wide-pair spacing to between 20 and 50 micrometers in the case of GaAs samples employed in these experiments.

For a net collection electrode spacing of 2 mm, this limits the number of pairs to between about 40 and about 100 pairs, providing a potential two-order of magnitude improvement over existing device responsivities. The noise equivalent surface displacement of the adaptive AIDC photo-EMF devices would then approach or exceed the values for conventional confocal Fabry-Perot interferometers in the MHz frequency range, but with significantly reduced complexity, size and cost.

Possible limitations to the scaling of the number of electrode pairs involve the resistance of the near-pairs, which can act to short the photo-EMF signal if their resistance becomes too small. In addition, the added capacitance, though negligible for 3-pair devices demonstrated here, may become comparable to other stray capacitance in the system, and ultimately limit the detection bandwidth.

It has been herein demonstrated how an enhancement of photo-EMF responsivity at constant detection area of asymmetric interdigitated surface contacts using above-bandgap illumination can be achieved. Designs using 1-pair, 2-pairs and 3-pairs showed simple scaling with the number of electrode pairs, or equivalently, with the decreasing electrode spacing, in agreement with the device physics. No evidence was seen for deviations from the simple scaling that might be caused by increased capacitance or by the electrode spacing relative to the diffusion length or the fringe spacing. These results suggest that significantly improved responsitivities should be attainable with large numbers of electrode pairs.

Although there has been hereinabove described a specific arrangement of photo-EMF apparatus in accordance with the present invention, for the purpose of illustrating the manner in which the invention may be used to advantage, it will be appreciated that the invention is not limited thereto. Accordingly, any and all modifications, variations, or equivalent arrangement which may occur to those skilled in the art should be considered to be within the scope of the invention as defined in the appended claims.

What is claimed is:

1. A photo-EMF detector for the collection of photons the detector comprising:
    a substrate formed of a semi-insulating photoconductor with sufficient carrier trap density to form an effective space charge grating;
    a plurality of interlaced electrode pairs disposed over the substrate, each electrode pair including two parallel electrodes defining an active area therebetween for the collection of photons, one electrode of each pair being disposed between an adjacent pair of electrodes and proximate one electrode of the adjacent pair;
    means for preventing back action current between proximate electrodes; and
    means for collecting outputs from each of the plurality of interlaced electrode pairs.

2. The detector according to claim 1 wherein the means for preventing back action current comprises means for preventing light from striking a substrate surface between proximate electrodes.

3. The detector according to claim 2 wherein said means for preventing light from striking the substrate surface between proximate electrodes comprises an opaque layer extending between proximate electrodes.

4. The detector according to claim 1 wherein said means for preventing back action current comprises grooves in the substrate between proximate electrodes.

5. The detector according to claim 1 wherein said means for preventing back action current comprises slots through the substrate between proximate electrodes.

6. The detector according to claim 1 wherein the means for preventing back action current comprises ions implanted in substrate portions between proximate electrodes in order to desensitize the substrate portion to incident light.

7. The detector according to claim 1 wherein the electrodes are continuous and coaxial.

8. The detector according to claim 7 wherein the electrodes are circular.

9. The detector according to claim 1 wherein the substrate comprises gallium arsenide.

10. The detector according to claim 1 wherein each pair of electrodes are spaced apart from one another by more than the greater of about one carrier diffusion length and one fringe period.

11. The detector according to claim 1 further comprising a heterostructure disposed between the substrate and the plurality of interlaced electrode pairs.

12. The detector according to claim 1 further comprising means for reducing capacitance between proximate electrodes.

13. The detector according to claim 12 wherein the means for reducing capacitance comprises grooves in the substrate between proximate electrodes.

14. The detector according to claim 12 wherein the means for reducing capacitance comprises slots through the substrate between proximate electrodes.

15. A photo-EMF detector for the collection of photons, the detector comprising:
   a substrate formed of a semi-insulating photoconductor with sufficient carrier trap density to form an effective space charge grating;
   a first plurality of interlaced electrode pairs disposed over the substrate, each electrode pair, of first plurality, including two parallel electrodes defining an active area therebetween for the collection of photons, one electrode, of each pair of the first plurality, being disposed between an adjacent pair of electrodes and proximate one electrode of the adjacent pair of the first plurality;
   a second plurality of interlaced electrode pairs disposed over the substrate, each electrode pair, of the second plurality, including two parallel electrodes defining an active area therebetween for the collection of photons, one electrode of each pair of the second plurality, being disposed between an adjacent pair of electrodes and proximate one electrode of the adjacent pair of the second plurality;
   means for preventing back action current between proximate electrodes, and
   means for collecting outputs from each of the first and second plurality of interlaced electrode pairs.

16. The detector according to claim 15 wherein the first and second plurality of electrodes are disposed adjacent to one another on said substrate.

17. The detector according to claim 16 wherein the first and second plurality of electrodes are parallel with one another.

18. The detector according to claim 16 wherein the first and second plurality of electrodes are perpendicular with one another.

19. The detector according to claim 16 further comprising means for desensitizing the substrate between the first and second plurality of electrodes.

20. The detector according to claim 15 wherein the first and second plurality of electrodes are disposed in a stacked relationship on said substrate.

21. The detector according to claim 20 further comprising an optically transparent, electrically insulating layer disposed between the first and second plurality of electrodes.

22. A photo-EMF detector for detecting a motion of an optical pattern, the detector comprising:
   a substrate formed of a semi-insulating photoconductor with sufficient carrier trap density to form an effective space charge grating;
   a plurality of interlaced electrode pairs disposed over the substrate, each electrode pair including two electrodes defining an active area therebetween for receiving one optical fringe, an electrode of each pair being disposed between an adjacent pair of electrodes and proximate one electrode of the adjacent pair;
   means for preventing back action current between proximate electrodes; and
   means for collecting outputs from each of the plurality of interlaced electrode pairs.

23. The detector according to claim 22 wherein the means for preventing back action current comprises means for preventing light from striking a substrate surface between proximate electrodes.

24. The detector according to claim 23 wherein said means for preventing light from striking the substrate surface between proximate electrodes comprises an opaque layer extending between proximate electrodes.

25. The detector according to claim 22 wherein said means for preventing light from striking the substrate surface between proximate electrodes comprises grooves in the substrate between proximate electrodes.

26. The detector according to claim 22 wherein said means for preventing light from striking the substrate surface between the perimeter electrode comprises slots through the substrate between proximate electrodes.

27. The detector according to claim 22 wherein the means for preventing back action current comprises ions implanted in substrate portions between proximate electrodes in order to desensitize the substrate portion to incident light.

28. The detector according to claim 22 wherein the electrodes are continuous and coaxial.

29. The detector according to claim 28 wherein the electrodes are circular.

30. The detector according to claim 22 wherein the substrate comprises gallium arsenide.

31. The detector according to claim 22 wherein each pair of electrodes are spaced apart from one another by more than the greater of about one carrier diffusion length and one fringe period.

32. The detector according to claim 22 further comprising a heterostructure disposed between the substrate and the plurality of interlaced electrode pairs.

* * * * *